United States Patent [19]

Rzedzian et al.

[11] Patent Number: 5,243,286
[45] Date of Patent: Sep. 7, 1993

[54] SPLIT SHIELD FOR MAGNETIC RESONANCE IMAGING

[75] Inventors: Richard Rzedzian, Lexington; Charles Martin, Arlington, both of Mass.

[73] Assignee: Advanced NMR Systems, Inc., Wilmington, Mass.

[21] Appl. No.: 546,503

[22] Filed: Jun. 29, 1990

Related U.S. Application Data

[63] Continuation-in-part of Ser. No. 534,156, Jun. 6, 1990, abandoned.

[51] Int. Cl.[5] ............................................. G01Y 3/00
[52] U.S. Cl. ..................................... 324/318; 324/322
[58] Field of Search ............... 324/318, 322, 313, 314, 324/307; 128/653.5

[56] References Cited

U.S. PATENT DOCUMENTS

| | | | |
|---|---|---|---|
| 4,549,042 | 10/1985 | Akiba et al. | 174/114 |
| 4,638,253 | 1/1987 | Jaskolski et al. | 324/318 |
| 4,642,569 | 2/1987 | Hayes et al. | 324/318 |
| 4,646,024 | 2/1987 | Schenck et al. | 324/318 |
| 4,694,255 | 9/1987 | Hayes | 324/318 |
| 4,737,716 | 4/1988 | Roemer et al. | 324/319 |
| 4,785,246 | 11/1988 | Sugimoto | 324/322 |
| 4,794,338 | 12/1988 | Roemer et al. | 324/39 |
| 4,871,969 | 10/1959 | Roemer et al. | 324/318 |
| 4,879,515 | 11/1989 | Roemer et al. | 324/318 |

Primary Examiner—Louis Arana
Attorney, Agent, or Firm—Fish & Richardson

[57] ABSTRACT

Narrower conductive strips are provided in a segmented RF shield to reduce the gradient coil power loss attributable to the shield. Narrower conductive strips reduce the eddy current losses experienced by the gradient coil, thereby reducing the power required to operate the gradient coil, especially in high speed imaging where high frequencies up to 10 KHz are used. The conductive strips can be made sufficiently narrow to substantially reduce the gradient coil power loss attributable to the shield. When these strips are made in this manner, a third conductive layer may be placed over a transition region where there is a substantial change in the direction of the conductive strips. In such a transition region, RF current tends to travel in curved paths across the pattern of conductive strips instead of along the lengths of the strips, with resulting decrease in coil quality factor, Q. The third conductive layer provides a lower impedance path for RF currents in the transition region, to reduce RF power loss. An ancillary conductor is connected to the RF shield in such a manner as to be insulated from the shield at the lower frequencies at which the gradient coil operates but capacitively connected at RF frequencies.

11 Claims, 3 Drawing Sheets

SPLIT SHIELD FOR MAGNETIC RESONANCE IMAGING

This application is a continuation-in-part of application Ser. No. 07/534,156, filed Jun. 19, 1990 now abandoned.

BACKGROUND OF THE INVENTION

This invention pertains to shields for RF coils in nuclear magnetic resonance systems.

Nuclear magnetic resonance (NMR) systems may be used as medical diagnostic tools. Generally, they consist of a region that holds the patient or sample surrounded by a set of coils. The outermost coil is usually a superconducting DC coil which provides a strong, constant magnetic field that polarizes the nuclei in the molecules of the sample or the patient's body. A smaller RF coil sits concentrically within the DC coil, and generates a time-varying RF field that excites the molecules and detects their response to this excitation. A coil assembly, generally referred to as the "gradient coil", occupies the space between the above coils and generates a time-varying audio frequency gradient field that causes the response frequency of nuclei to depend on their positions within the field. This imparted spatial information allows the generation of an image of the areas excited by the RF coil.

It is known to provide a shield between the RF coil and the gradient coil for containing the RF energy but allowing audio frequency magnetic fields to pass through. This shield may be made with two overlapping conductive layers which include insulating channels dividing the layers into conductive strips. It is also known to orient these conductive strips in the direction of the current flow induced in the shield by the RF coil. RF coil shields of this type are discussed in U.S. Pat. No. 4,642,569 of Hayes, entitled "Shield for Decoupling RF and Gradient Coils in an NMR Apparatus" (incorporated by reference).

SUMMARY OF THE INVENTION

The invention features, in a first aspect, providing narrower conductive strips to reduce the gradient coil power loss attributable to the shield. Narrower conductive strips reduce the eddy current losses experienced by the gradient coil (as an equivalent series resistance), thereby reducing the power required to operate the gradient coil, especially in high speed imaging where high frequencies up to 10 KHz are used. In preferred embodiments, the conductive strips are sufficiently narrow to make the power loss attributable to the shield less than that achievable with prior art shields (e.g., less than 1 kW at 1 kHz when placed in a 1 G/cm rms sinusoidal magnetic gradient field); and the strips are less than three inches in width.

In a second aspect, the invention features a third conductive layer placed over a transition region where there is a substantial change in the direction of the conductive strips. In such a transition region, RF current tends to travel in curved paths across the pattern of conductive strips instead of along the lengths of the strips, with resulting increase in RF leakage. The third conductive layer provides a lower impedance path for RF currents in the transition region to reduce this RF leakage and resultant power loss in various conductors outside the shield.

In a third aspect, the invention features connecting an ancillary conductor to the RF shield so that the conductor is insulated from the shield at the lower frequencies at which the gradient coil operates but is capacitively connected at RF frequencies.

This invention allows the construction of a shield that is more transparent and less lossy to the audio frequency gradient coil field, thus reducing the power required by the gradient coil. This reduction in power is advantageous in its own right, and is also advantageous because the gradient coils are typically driven by expensive, high-precision amplifiers. In addition, eddy currents generated by the changing magnetic fields of the gradient coil, when confined to the narrower strips of the RF shield of this invention will produce less distortion in the sensitive imaging volume and may result in better imaging performance.

The invention can be employed in MR systems using both sinsuoidal and trapezoidal waveforms. With trapezoidal waveforms, it reduces power loss and eddy currents associated with the changing fields during the rise times.

Other features and advantages of the invention will become apparent from the following description of a preferred embodiment and from the claims.

DESCRIPTION OF THE PREFERRED EMBODIMENT

Figure 1:
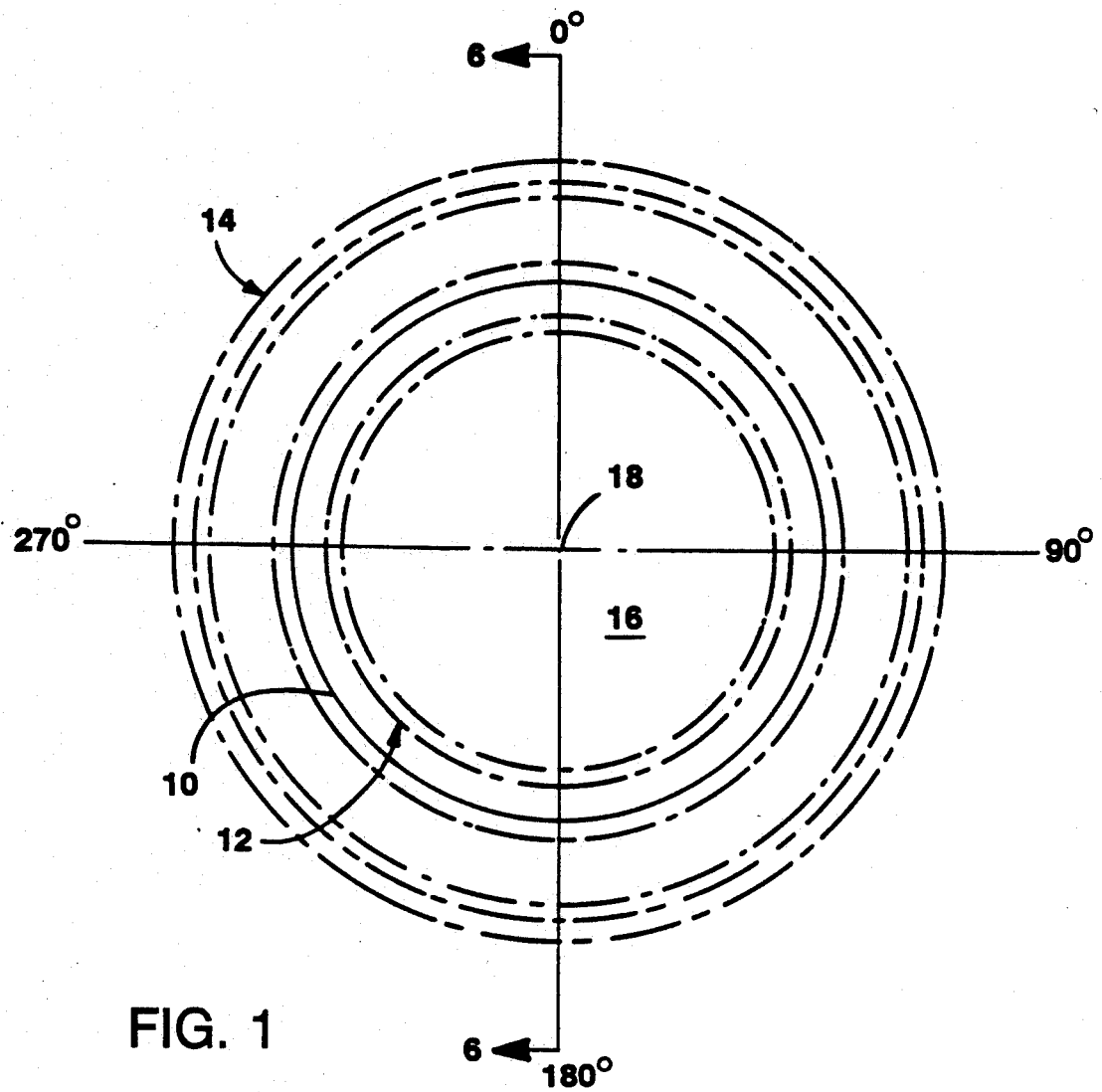
FIG. 1 is a cross-sectional diagram illustrating the position of the shield with respect to the gradient and RF coils.

Referring to FIG. 1, a diagnostic NMR apparatus includes a cavity 16, for examining a patient, surrounded by a cylindrical RF coil 12. This coil 12 alternatively provides an RF field that excites the nuclei in the molecules of the patient's body and acts as a receiver to detect the response of the nuclei to their overall excitation by the NMR apparatus. The RF coil is of the type known as a birdcage resonator. Briefly, this type of coil is generally cylindrical and it provides circumferential current paths at its ends, and longitudinal paths in the center of its cylindrical walls. Birdcage resonators are discussed in U.S. Pat. No. 4,694,255 of Hayes et al. entitled "Radio Frequency Coil for NMR".

The RF coil 12 is surrounded by a shield 10 which is in turn surrounded by a gradient coil assembly 14. The gradient coil assembly is made up of three coils: an X coil, a Y coil, and a Z coil. These coils generate audio frequency magnetic fields that allow spatial resolution of the NMR phenomenon within the cavity. The RF coil, its shield and the gradient coil assembly and main magnet are optimally concentrically arranged around the center of the NMR apparatus 18.

The shield 10 is essentially opaque to RF energy and thus contains the RF field. This shield prevents the loss of RF energy and unwanted interaction between any leaking RF energy and other parts of the system. The shield must not be, however, opaque to audio frequency signals and must permit the field from the gradient coil assembly 14 to penetrate into the cavity 16. The shield thus acts as a low-pass filter, blocking RF energy while passing the lower frequency audio energy.

The power loss attributable to the RF shield is less than that achievable with prior art shields. The preferred embodiment produces a power loss of about 1.0 kW at 2 kHz (0.25 kW at 1 kHz; 16.0 kW at 8 kHz), for a shield placed in a 1 G/cm rms sinsuoidal magnetic gradient field. Note that these losses follow approximately a square-law dependency with frequency. Greater power loss could be accomodated in other embodiments. Preferably the power loss attributable to the shield (for a whole body MR system) is less than 4 kW at 2 kHz (1 kW at 1 kHz; 0.25 kW at 500 Hz), and more preferably less than 2 kW at 2 kHz (0.5 kW at 1 kHz; 0.125 kW at 500 Hz), for a shield placed in a 1 G/cm rms sinsuoidal magnetic gradient field. For shields used in smaller or larger MR systems, these power loss criteria scale with the radius of the RF shield, which in the preferred embodiment is 32.2 cm. Similarly, for shields of different length from that used in the preferred embodiment (137 cm), these power loss criteria also must be scaled.

Figure 2:
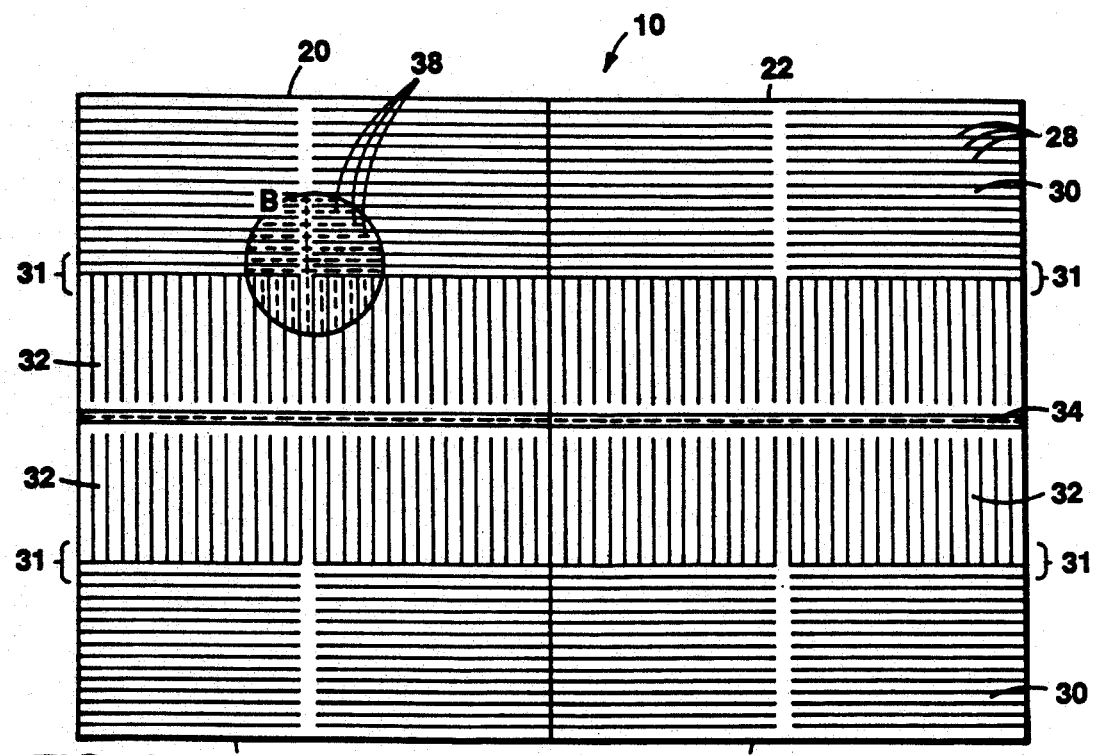
FIG. 2 is a view of the outer layer of the shield before assembly.

FIG. 2 shows the outside layer 43 of a shield 10 for the birdcage resonator RF coil before it is rolled into its final cylindrical configuration. This shield is made up of four individual printed circuit boards 20, 22, 24, 26. These circuit boards are assembled in the orientation shown with solder strip 34, which is shown holding printed circuit board pair 22 and 26 and printed circuit board pair 20 and 24 together at what will ultimately be the circumference of the center of the cylinder.

The surface of the shield shown in FIG. 2 is generally made up of an outside conductive layer 43 which is divided by etched channels 28. The etched channels define circumferential strip-shaped areas 30 at the edges of the cylinder walls and longitudinal strip-shaped areas 32 at the central portion of the cylinder walls. These areas are oriented to generally match the current path in the birdcage resonator, as a mirrored version of this current will be induced in the shield during operation of the RF coil. The circumferential strip-shaped areas 30 are typically 1 inch wide and the longitudinal strip-shaped areas are typically 1.26 inches wide. The regions 31 where the longitudinal area and the circumferential areas meet are called "transition regions".

Figure 3:
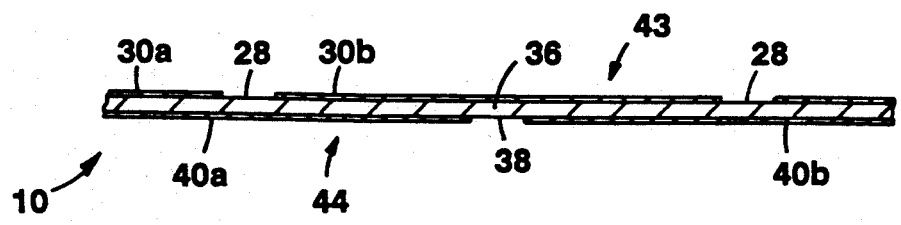
FIG. 3 is a cross-section of a portion of the circuit board that makes up the inner and outer layers of the shield in the part of the shield where the strip-shaped areas are circumferential.

Referring to FIG. 3, the shield 10 is made up of a two-sided flexible printed circuit board comprising an inside conducting layer 44 and an outside conducting layer 43 separated by an insulating substrate 36. The circuit board is typically made of a 5 mil teflon/glass substrate (Norplex Oak #605) with 1 ounce copper layers, and the channels are etched to 31 mils wide. The outside layer is divided into areas 30a, 30b by channels 28, as described above in connection to FIG. 2. The inside layer is similarly divided into areas 40a, 40b by inside layer channels 38 which are offset from the outside layer channels 28. Channels on one layer are always overlapped by conductive regions on the other layer, and thus inner layer channels never overlap outer layer channels. This permits the shield to be opaque to RF. The area of FIG. 2 marked "B" shows the channels from both layers superimposed (the inside layer channels are drawn in dashed lines) and illustrates the way these channels are intermingled to avoid the overlapping of channels.

The overlapping of areas of the two layers capacitively couple adjacent regions on each side of a channel. For example, channel 38 separates areas 40a and 40b and prevents any direct current flows between them across the channel, but the areas of overlap between areas 40a, 40b, and 30b form capacitors which allow currents at RF frequencies to flow from inside area 40a to outside area 30b to inside area 40b again. At RF, then, the entire shield looks somewhat like a continuous conductive cylindrical sheet. The channels, however, break up eddy currents at audio frequencies. The overlapping is apparent when comparing the placement of the outer layer strip-shaped areas 30, 32 (FIG. 2) and the inner layer strip-shaped areas 40, 42 (FIG. 4).

Figure 4:
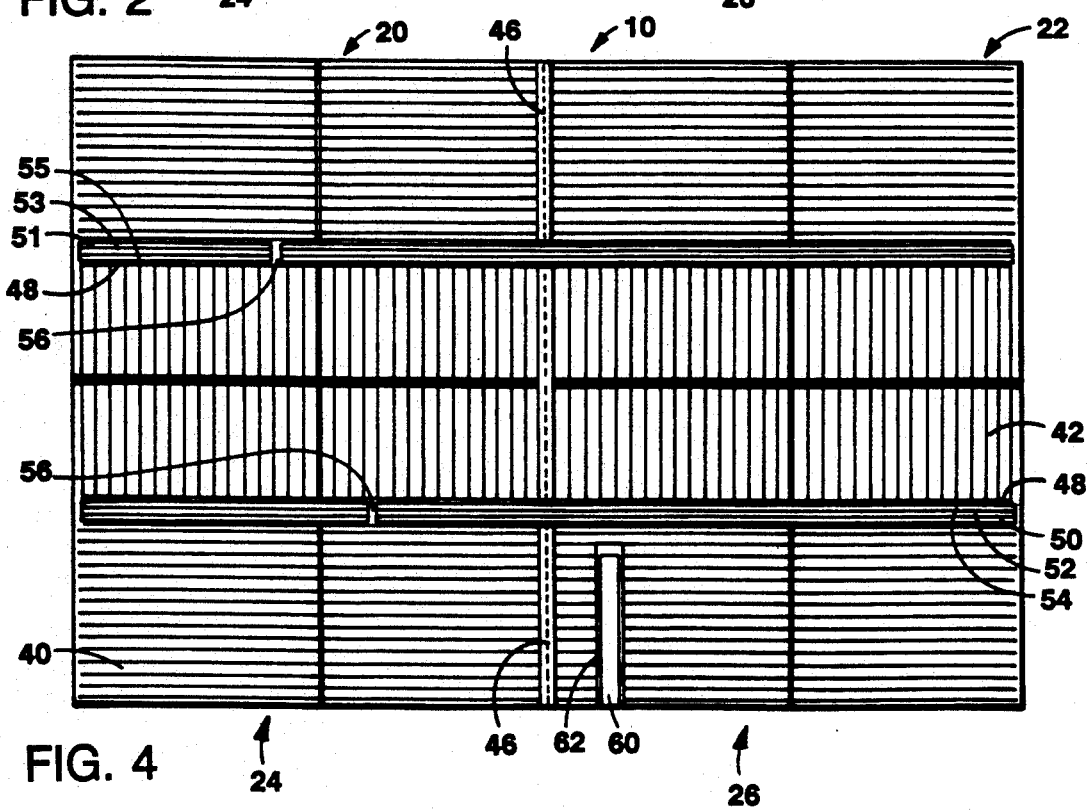
FIG. 4 is a partially assembled view of the inner layer of the shield showing the third conductive layer which shields the transition layer.

Referring to FIG. 4, further assembly of the shield 0 is shown. A second length of solder strip 46 is applied to the inside of the shield 10 at right angles from the first piece 34 to hold printed circuit board pair 20 and 22 and printed circuit board pair 24 and 26 together along the length of the cylinder.

A layer of 2 inch wide 1 mil thick insulating Kapton tape 48 is placed over each transition region, and three ¼ inch strips of 1 ounce copper tape are placed on each piece of Kapton tape in parallel strips 50, 52, 54 & 51, 53, 55 thus forming a third conductive layer over the transition regions. This third layer improves the RF shielding at the transition regions which are found to be regions of high loss. The third layer is split into three strips to reduce induced eddy currents at audio frequencies. The resulting shield contains RF fields almost as effectively as a shield with wider conductive areas on its inner and outer layers, but is more transparent and less lossy to audio frequency fields. In the preferred embodiment, the RF operating frequency is approximatly 64 MHz (1.5 Tesla).

Figure 5:
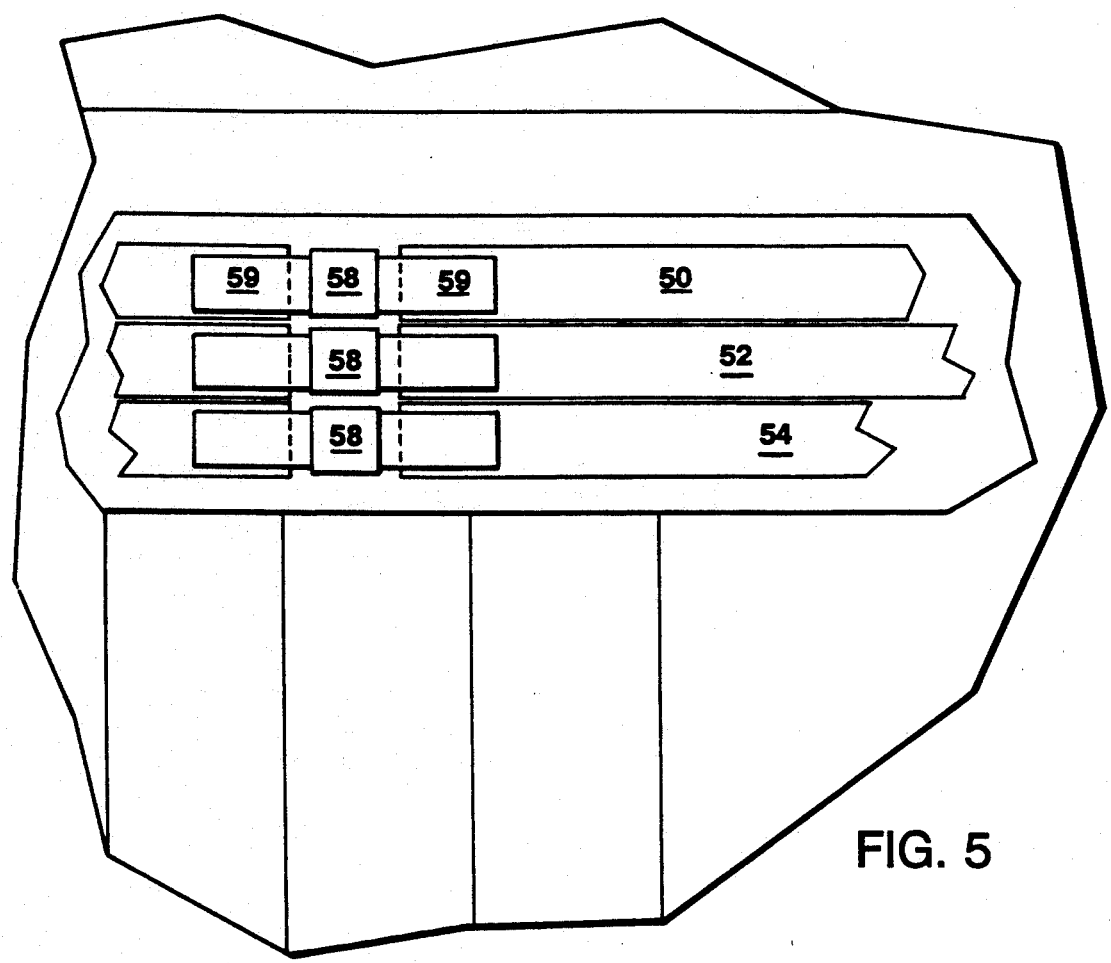
FIG. 5 is a detailed view of the third conductive layer at the point of attachment of its associated capacitors.

The strips 50, 52, 54 & 51, 53, 55 ar Ⓡinterrupted by gaps 56 Which accommodate capacitors 58 that are soldered to the strips by leads 59 (See FIG. 5). These capacitors prevent low frequency eddy currents from flowing around these areas, but allows RF currents to flow. The capacitors are 3000 pF capacitors, and the gaps that they are inserted in are 0.75 inches wide. The strips are separated from each other by a distance of 32 mils.

In many embodiments of MR equipment, elements to drive and tune the RF coil are electrically attached to this shield. All such RF grounding attachments must be made capacitively so that audio eddy currents cannot be carried through these grounds. Therefore, also applied to the inside surface of the shield are pieces of Kapton tape 62 with superimposed areas 60 of 1.5 inch copper tape forming further areas of a third layer of the shield. These areas are electrically insulated from the inside conductive layer, but are capacitively coupled thereto. These areas may then be electrically connected to the ancillary conductors comprising the tuning, driving and matching equipment.

Other embodiments are within the scope of the following claims. It should be noted that the sequence of layers presented above could be different without significantly changing the electromagnetic properties of the shield. For example, the shielding of the transition regions could be applied to the outside of the shield. It also should be noted that the transition region shielding and cable mounting strips could be integral to a printed circuit board layer instead of being implemented with copper tape.

What is claimed is:

1. A shield for an RF coil in a nuclear magnetic resonance system for containing the field generated by said RF coil while allowing lower frequencies to pass through said shield, said shield comprising:
    an outer main layer composed of a plurality of conductive strips separated by a plurality of insulating channels;
    an inner main layer composed of a plurality of conductive strips separated by a plurality of insulating channels;
    the orientation of said conductive strips varying in different regions of said shield, there being at least three regions
    a first region wherein said conductive strips extend in a first direction and current travels generally along the length of said strips in said first direction,
    a second region wherein said conductive strips extend in a second direction substantially different from said first direction and current travels generally along the length of said strips in said second direction, and
    at least one transition region located between said first and second regions wherein current changes direction from said first to said second direction and thus travels across said insulating channels;
    a third layer composed of at least one conductive area overlapping at least some part of said transition region; and
    insulating layers separating said inner main layer, outer main layer and third layer from each other.

2. The shield of claim 1 wherein
said inner main layer and said outer main layer are cylindrically shaped,
said conductive strips extend longitudinally along the longitudinal axis of said cylindrically shaped layers in one of said first and second regions,
wherein said conductive strips extend circumferentially in the other of said first and second regions, and
wherein said transition region is located at the boundary where the longitudinally extending strips meet the circumferentially extending strips, and where current changes from a longitudinal to a circumferential direction (or vice versa).

3. A shield for an RF coil in a nuclear magnetic resonance system for containing the field generated by said RF coil while allowing lower frequencies to pass through said shield, said shield comprising:
    a generally cylindrical outer main layer composed of a plurality of conductive strips separated by a plurality of insulating channels;
    a generally cylindrical inner main layer composed of a plurality of conductive strips separated by a plurality of insulating channels, and being generally concentric with said outer main layer;
    a generally cylindrical third layer with one or more conductive regions, and being generally concentric with said inner and outer main layers; and
    generally cylindrical insulating layers separating said inner main layer, outer main layer, and third layer.

4. The shield of claim 3 wherein said conductive strips extend longitudinally in one region and circumferentially in another region.

5. The shield of claim 1 or 3 wherein said insulating channels on said inner and outer main layers are placed such that they essentially never overlap each other.

6. The shield of claim I or 3 wherein said insulating channels form a pattern which essentially reflects the wiring orientation of an RF coil.

7. The shield of claim 6 wherein said RF coil is of the type know as a birdcage resonator.

8. The shield of claim 1 or 3 wherein said shield is manufactured using printed circuit board techniques.

9. The shield of claim 1 or 3 wherein third layers is radially inside of said inner and outer main layers.

10. The shield of claim 1 or 3 wherein said third layer is split into a plurality of areas.

11. The shield of claim 1 or 3 wherein a portion of said third layer comprises one or more gaps in said layer and said gaps are bridged by one or more capacitors.

* * * * *

UNITED STATES PATENT AND TRADEMARK OFFICE
CERTIFICATE OF CORRECTION

PATENT NO.   : 5,243,286

DATED        : September 7, 1993

INVENTOR(S)  : Richard Rzedzian and Charles Martin

It is certified that error appears in the above-identified patent and that said Letters Patent is hereby corrected as shown below:

On the Title Page, Item [56] References Cited, U.S. PATENT DOCUMENTS, in U.S. Patent No. 4,871,969, "10/1959" should be --10/1989--.

Column 1, line 6, "Jun. 19, 1990" should be --Jun. 6, 1990--.

Column 4, line 15, "shield 0" should be --shield 10--.

Column 4, line 36, "ar ®" should be --are--.

Column 4, line 37, "Which" should be --which--.

Column 6, line 26, "claim I or 3" should be --claim 1 or 3--.

Signed and Sealed this

Nineteenth Day of April, 1994

Attest:

BRUCE LEHMAN

*Attesting Officer*   *Commissioner of Patents and Trademarks*